United States Patent [19]
Berra et al.

[11] Patent Number: 5,555,498
[45] Date of Patent: Sep. 10, 1996

[54] CIRCUIT AND METHOD FOR INTERFACING VEHICLE CONTROLLER AND DIAGNOSTIC TEST INSTRUMENT

[75] Inventors: Charles J. Berra; John R. Boldt, both of Troy; Alan J. Amici, Dearborn; Joseph J. Krebs, Rochester Hills, all of Mich.

[73] Assignee: Chrysler Corporation, Auburn Hills, Mich.

[21] Appl. No.: 210,673

[22] Filed: Mar. 18, 1994

[51] Int. Cl.⁶ .................................................. G06F 13/00
[52] U.S. Cl. ..................................... 364/424.03; 395/285
[58] Field of Search ........................ 364/424.01, 424.03, 364/424.04, 551.01; 340/438; 395/500, 285, 286

[56] References Cited

U.S. PATENT DOCUMENTS

| | | | |
|---|---|---|---|
| Re. 31,582 | 5/1984 | Hosaka et al. | 364/431.04 |
| 4,207,611 | 6/1980 | Gordon | 364/580 |
| 4,234,921 | 11/1980 | Kinoshita et al. | 364/424.03 |
| 4,375,672 | 3/1983 | Kato et al. | 364/551.01 |
| 4,602,127 | 7/1986 | Neely et al. | 364/431.03 X |
| 4,694,408 | 9/1987 | Zaleski | 364/551.01 |
| 4,706,082 | 11/1987 | Miesterfeld et al. | 340/825.5 |
| 4,719,458 | 1/1988 | Miesterfeld et al. | 340/825.5 |
| 4,739,323 | 4/1988 | Miesterfeld et al. | 340/825.5 |
| 4,739,324 | 4/1988 | Miesterfeld et al. | 340/825.5 |
| 4,742,349 | 5/1988 | Miesterfeld et al. | 340/825.5 |
| 4,831,560 | 5/1989 | Zaleski | 364/551.01 |
| 4,853,850 | 8/1989 | Krass, Jr. et al. | 364/424.03 |
| 4,866,616 | 9/1989 | Takeuchi et al. | 364/424.04 |
| 4,875,391 | 10/1989 | Leising et al. | 74/866 |
| 4,962,456 | 10/1990 | Abe et al. | 364/424.03 X |
| 4,964,046 | 10/1990 | Abe et al. | 364/551.01 |
| 4,975,846 | 12/1990 | Abe et al. | 364/424.03 |
| 4,975,847 | 12/1990 | Abe et al. | 364/424.03 |
| 5,003,476 | 3/1991 | Abe | 364/424.03 |
| 5,003,477 | 3/1991 | Abe et al. | 364/424.03 |
| 5,056,023 | 10/1991 | Abe | 364/424.03 |
| 5,077,670 | 12/1991 | Takai et al. | 364/424.03 |
| 5,081,667 | 1/1992 | Drori et al. | 379/59 |
| 5,096,139 | 3/1992 | Feld et al. | 244/3.1 |
| 5,107,428 | 4/1992 | Bethencourt et al. | 364/424.04 |
| 5,132,905 | 7/1992 | Takai et al. | 364/424.03 |
| 5,278,759 | 1/1994 | Berra et al. | 364/424.01 |
| 5,365,436 | 11/1994 | Schaller et al. | 364/424.03 |
| 5,377,109 | 12/1994 | Baker et al. | 364/551.01 X |
| 5,416,917 | 5/1995 | Adair et al. | 395/500 |

OTHER PUBLICATIONS

Resolution #93–40, State of California Air Resources Board, Amendments to Regulations Regarding On–Board Diagnostic System Requirements for 1994 and Later Passenger Cars, Light–Duty Trucks, and Medium–Duty Vehicles and Engines (OBD II), Jul. 1993.
ISO9141-2, International Standard, Road Vehicles–Diagnostic systems–Part 2: CARB requirements for interchange of digital information. No date.
890529, The All–Adaptive Controls for the Chrysler Ultra Drive Transaxle, Maurice B. Leising, Howard Benford and Gerald L. Holbrook, Chrysler Motors Corp. Mar. 21, 1994.
Enrironmental Protection Agency, Feb. 19, 1993, 40 CFR Part 88 Control of Air Pollution From New Motor Vehicles; Final Rule, Federal Register, vol. 58, No. 32, pp. 9468–9488.
SAE Technical Paper Series, No. 860389, "Chrysler Collision Detection (C²D)–A Revolutionary Vehicle Network", Frederick O. R. Miesterfeld, Feb. 24–28, 1986.
Chrysler 1983–1988 Instruction Manual, entire book, System 2000 Diagnostics, Feb. 1988.
3–in–1 Instruction Manual Monitor 4000E, Apr. 1990, entire book.
SAE Standard J1850, Class B Data Communication Network Interface, Mar. 9, 1994.

Primary Examiner—Collin W. Park
Attorney, Agent, or Firm—Mark P. Calcaterra

[57] ABSTRACT

An adapter which permits the use of present diagnostic tools with newer ISO9141 equipped engine and transmission controllers. The adapter facilitates bi-directional communication while conditioning the signals entering and exiting the adapter and allow the diagnostic tools to operate transparent of the adapter's presence.

19 Claims, 2 Drawing Sheets

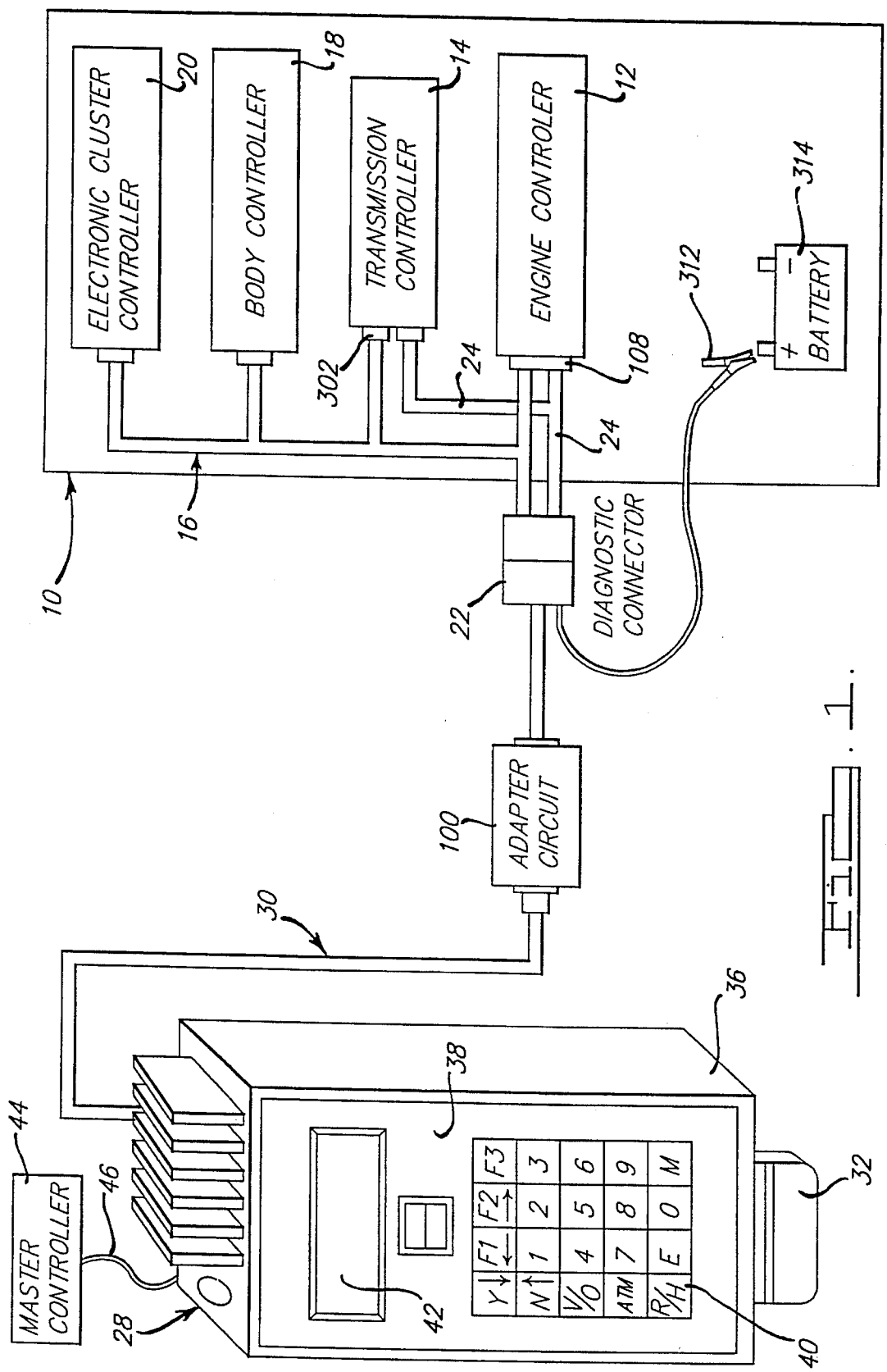

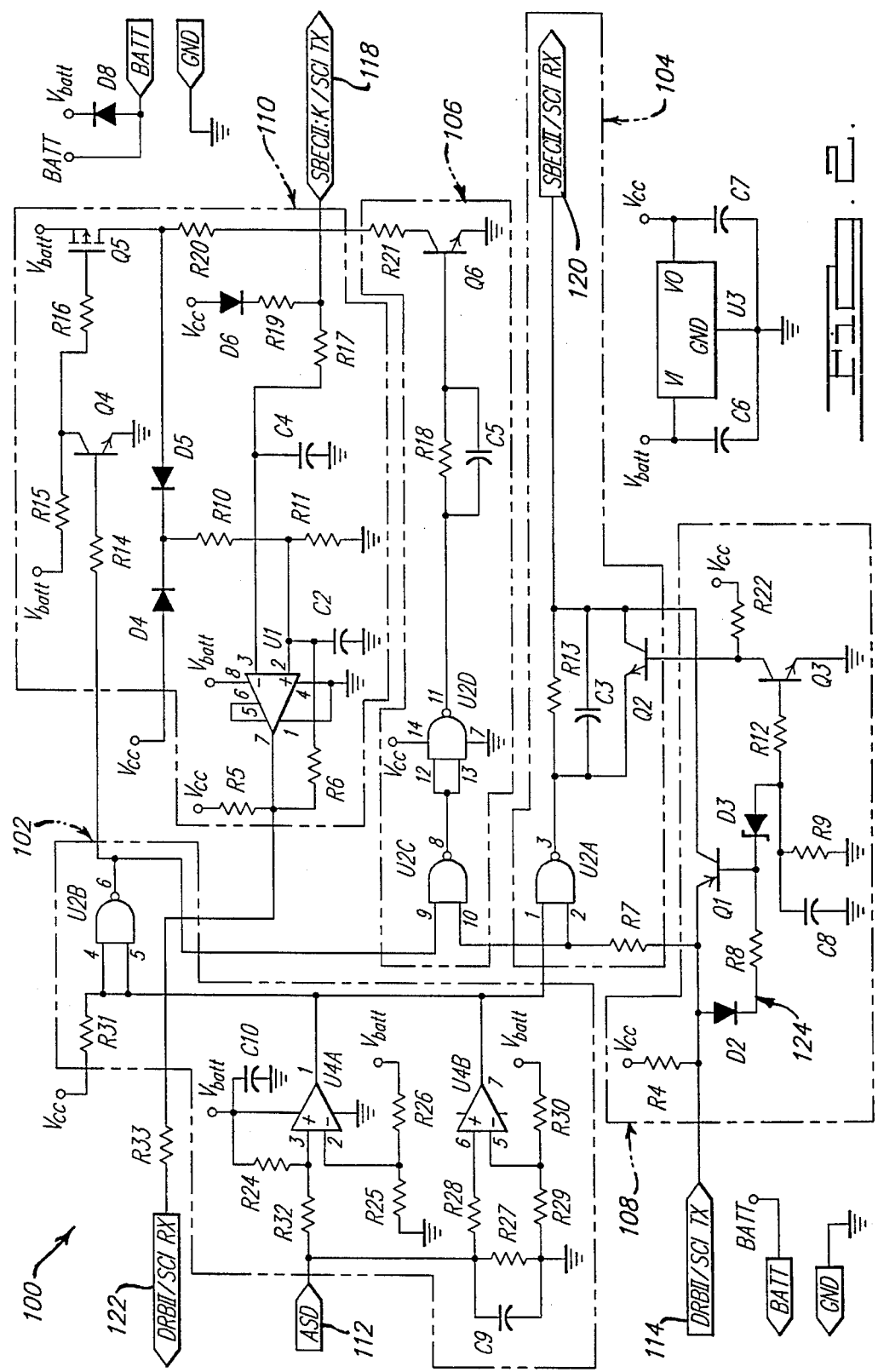

CIRCUIT AND METHOD FOR INTERFACING VEHICLE CONTROLLER AND DIAGNOSTIC TEST INSTRUMENT

BACKGROUND OF THE INVENTION

The present invention relates generally to on-board vehicle computer systems and, more particularly, to a service adapter for allowing access by existing diagnostic tools to new on-board vehicle computer systems.

For over a decade, computers have been used on vehicles to control various vehicle systems such as engine and transmission systems, brake systems, suspension systems and even motorized seats. Due to the complexity and interrelationship between some of these vehicle systems, on-board computer communication systems have been developed to enable data and control signals to be passed between particular vehicle computers. These communication systems typically include a plurality of wires which are connected to the vehicle computers in a particular electronic configuration, generally referred to as a "bus".

One example of vehicle bus structure is represented by the Chrysler Collision Detection ("$C^2D$") Serial Data Bus. This technology is described in the following publications and patents: SAE paper No. 860389, entitled "Chrysler Collision Detection ($C^2D$)—A Revolutionary Vehicle Network", by Frederick O. R. Miesterfeld, 1986; SAE paper No. 890529, entitled "The All-Adaptive Controls for the Chrysler Ultradrive Transaxle", 1989; U.S. Pat. No. 4,706,082, entitled "Serial Data Bus For Intermodule Data Communications," which issued on Nov. 10, 1987; and U.S. Pat. No. 4,719,458, entitled "Method of Data Arbitration and Collision Detection In A Data Bus," which issued on Jan. 12, 1988; and U.S. Pat. No. 4,739,323, entitled "Serial Data Bus For Serial Communication Interface (SCI), Serial Peripheral Interface (SPI) and Buffered SPI Modes of Operation," which issued on Apr. 19, 1988; and U.S. Pat. No. 4,739,324, entitled "Method for Serial Peripheral Interface (SPI) in a Serial Data Bus," which issued on Apr. 19, 1988; and U.S. Pat. No. 4,742,349 entitled "Method for Buffered Serial Peripheral Interface (SPI) in a Serial Data Bus", which issued on May 3, 1988. These co-assigned patents and the identified publications are all hereby incorporated by reference.

In order to permit the bus itself to be tested and to permit direct access to and communication with any of the vehicle computers tied to the vehicle bus, the serial data bus may be accessible to an off-board vehicle computer, such as an attachable diagnostic tool. One such tool is the DRBII Diagnostic Readout Box that is commercially available to Chrysler dealerships. Another is the more advanced DRBIII diagnostic tool described in U.S. patent application Ser. No. 08/083,050, filed Jun. 25, 1993, entitled "Automotive Diagnostic Scan Tool". This co-assigned application for patent is also incorporated herein by reference. This type of diagnostic tool is typically employed to conduct serial communications directly with the on-board vehicle computers during certain diagnostic procedures. Thus, for example, data being gathered by the on-board vehicle computer from various sensors (such as engine speed and manifold pressure) may be transmitted to an off-board computer for programmed or operator directed analysis.

Such a diagnostic tool may also be used to enable a test program from an off-board computer to be "down-loaded" into a vehicle-based computer system in order to execute one or more prescribed tests of various vehicle systems before the vehicle leaves the manufacturing facility. The nonvolatile memory of one or more on-board vehicle computers can even be reprogrammed at a later date through a communication link between an off-board controller and the signal transfer structure of the vehicle via an appropriate diagnostic tool. This reprogramming process is described in greater detail in a co-assigned patent entitled "System and Method for Reprogramming a Vehicle Computer", issued on Jan. 11, 1994 as U.S. Pat. No. 5,278,759, the contents of which are also incorporated herein by reference.

In response to the heavy reliance on such on-board computers, combined with a variety of systems employed by the various automobile manufacturers, future vehicles sold in the United States will soon be required to provide a standardized diagnostic interface to facilitate compatibility with standardized diagnostic scan tools. This restriction is referred to as the CARB/OBDII (California Air Research Board/On Board Diagnostics II) requirement and applies to new vehicles beginning in the 1994 model year and all vehicles in the 1996 model year. The CARB/OBDII requirement offers a choice between several communication protocol specifications, among them ISO9141. The OBDII requirement and the ISO9141 are hereby incorporated by reference.

The on-board computer systems in new vehicles will necessarily be in compliance with the CARB/OBDII requirement and therefore able to use ISO9141 standard communication to supply information to general industry scan tools, such as for example, those used to perform emissions tests. However, communication solely under the ISO9141 standard will thereby render existing diagnostic tools such as the DRBII, which operate using SCI standard signals, incompatible with the new vehicle on-board computer systems. There is therefore a need for a means to interface existing diagnostic tools such as the DRBII with the new vehicle on-board computer systems which are in conformance with the new CARB/OBDII requirements.

SUMMARY OF THE INVENTION

Accordingly, the present invention provides a service adapter which permits the use of present diagnostic tools with newer ISO9141 equipped engine and transmission controllers. The adapter functions as a bus interface converter to be used in conjunction with existing diagnostic equipment and thereby allows test equipment to serially communicate with electronic vehicle controllers having bus interface hardware which has been modified in order to provide the ISO9141 bus interface required as part of OBDII. The adapter facilitates bi-directional communication while conditioning the signals entering and exiting the adapter and allows the diagnostic tools to operate transparent of the adapter's presence.

In so doing, the adapter provides two modes of bus interface support; an SCI II mode and an ISO9141 mode.

BRIEF DESCRIPTION OF THE DRAWINGS

Additional objects, advantages, and features of the present invention will become apparent from the following description and appended claims, taken in conjunction with the accompanying drawings in which:

FIG. 1 is a diagrammatic representation of a portable diagnostic tool and serial communication link that may be utilized to monitor the functions of an on-board computer in accordance with the present invention; and FIG. 2 is a schematic circuit diagram which illustrates the adapter of the present invention as provided by the system shown in FIG. 1.

DETAILED DESCRIPTION OF THE PREFERRED EMBODIMENT

Referring to FIG. 1, a vehicle 10 includes a plurality of on-board vehicle computer circuits or controllers, such as an engine controller 12, automatic transmission controller 14, body controller 18 and electronic cluster controller 20. Each of these on-board vehicle computer circuits or controllers are connected to a vehicle signal transfer structure 16, which could include, for example, the Chrysler Collision Detection (CCD) Serial Data Bus mentioned above. The signal transfer structure 16 may also include individual serial communications links to on-board vehicle computer circuits that are not part of a shared or common bus structure for all on-board vehicle computer circuits. It should be appreciated that a variety of suitable vehicle signal transfer structures may be employed to permit communication with computer circuits on the vehicle 10, and that the principles of the present invention are not limited to any particular vehicle signal transfer structure.

FIG. 1 also shows a diagnostic connector 22 which is connected to the various on-board controllers through the vehicle signal transfer structure 16. The diagnostic connector 22 is further connected to the engine controller 12 and transmission controller via an ISO9141 serial data bus 24. In addition, the diagnostic connector 22 is adapted to receive a direct current (dc) power signal from the vehicle battery 314 via a connector 312. A diagnostic tool 28 may be connected to the diagnostic connector 22 through a cable structure 30. The diagnostic tool 28 provides an off-board control unit which is capable of transmitting signals to the on-board vehicle computer circuits through the cable structure 30.

In this particular embodiment, the diagnostic tool 28 is preferably a DRBII Diagnostic Readout Box that is commercially available to Chrysler dealerships. However, while the DRBII unit provides an advantageous diagnostic tool, it should be appreciated that other suitable off-board controllers may be used in the appropriate application. Diagnostic tool 28 may further include a plug-in module 32 which is removably secured to the diagnostic tool and which may contain such things as diagnostic routines or one or more non-volatile memory chips which can be used to store a new computer program to be transmitted to nonvolatile memory ("flash" memory) of an on-board vehicle computer circuit being reprogrammed. Such reprogramming may be done through an application specific flash adapter (not shown), as described in more detail in an above-referenced incorporated application.

As shown in FIG. 1, the DRBII diagnostic unit 28 includes a portable housing 36 which may be hand held near or in the vehicle 10 by a service technician. The front panel 38 of the DRBII unit includes a keypad 40 for entering data or instructions in an interactive communication process with the DRBII unit. In this regard, the DRBII unit includes a display 42 which is capable of visibly displaying several lines of character and numeric information. Thus, for example the DRBII unit may prompt the service technician to enter particular information from the keypad 40 by producing a specific request on the display 42. The diagnostic tool 28 may also be connected to a master controller 44, such as a personal computer, via cable 46 or any other suitable electronic communication means.

In order to provide CARB/OBDII standardized communication capabilities in the vehicle controller, while avoiding any circuit modifications to a DRBII unit or similar diagnostic tool not directly compatible with this new protocol, the cable structure 30 is uniquely constructed to include the in-line service adapter circuit of the present invention which is generally designated by the adapter circuit block 100 in FIG. 1. The adapter circuit 100 is constructed in cable structure 30, preferably between the diagnostic tool 28 and the diagnostic connector 22. As will be more fully appreciated from the description below as well as reference to the schematic diagram of FIG. 2, the adapter circuit 100 includes switching circuits and voltage translation circuits for converting certain specific command signals from the diagnostic tool 28 to command signals having predetermined voltage levels that are required to operate in the SCI and ISO modes, as well as the flash programming mode.

Adapter circuit 100 includes various standardly available electronic components which have been arranged in five main functional groups. These five functional groups are ISO9141/SCI II communication mode enable circuitry 102, logic level SCI (Serial Communication Interface) receive circuitry 104, ISO9141 K-line circuitry 106, high voltage bypass circuitry 108 and an SCI II transmit/ISO9141 transmit circuit 110. ISO9141/SCI II enable circuitry 102 has as an input ASD (Auto Shut Down) pin 112, the signal applied to which determines whether the adapter 100 will function in the SCI or the ISO mode or protocol, as discussed in detail below.

SCI MODE

If the ASD input pin 112 is left floating, or tri-stated, the adapter circuit 100 will function in the SCI mode. This mode facilitates full duplex serial communication between an electronic controller and a diagnostic test tool as follows. In the SCI mode, with ASD input 112 left floating or tri-stated, the output of pins 1 and 7 of comparators U4A and U4B, through resistors R32 and R28, respectively, are at a logical "high" level (in this instance $V_{cc}=5$ V). This "high" state on pins 1 and 7 drives input pins 4 and 5 of NAND gate U2B "high" and therefore output pin 6 of NAND gate U2B to a "low" state (ground). This grounds input pin 9 of NAND gate U2C which thus disables any messages from DRBII/SCI TX transmit port 114 appearing on input pins 10 and 2 of NAND gates U2C and U2A, respectively, through resistor R7, from reaching output SBECII:K/SCI TX port 118. SBECII represents Single-Board Engine Controller II. At the same time, "high" outputs on pins 1 and 7 of comparators U4A and U4B enable messages from DRBII/SCI TX input pin 114 to reach output SBECII/SCI RX receive port 120 by pulling the input to pin 1 of NAND gate U2A to a logical "high" state.

Based upon this SCI mode initialization, communication can now take place between the DRBII tool 28 and the various vehicle controllers in the SCI mode. An input signal appearing on DRBII/SCI TX input pin 114, typically in the 0–5 V range, is now transmitted along a path through resistor R7, NAND gate U2A, and resistor R13 out to the SBECII/SCI RX pin 120 of receive circuitry 104 as a 0–5 V message. In doing so, NAND gate U2A inverts the communication data.

At the same time, a 0–5 V signal on SBECII:K/SCI TX pin 118 passes through resistor R17, is inverted by comparator U1 and provides an output signal to the DRBII/SCI RX output port 122 through resistor R33. The adapter circuit 100 thus enables SCI mode full duplex communication. While the internal circuitry provides independent transmit and receive paths, it can be considered bi-directional communication from an external viewpoint.

To initiate reprogramming or what is called "flash programming" of an electronic controller, a 12 V dc signal, termed a "bootstrap" voltage, must be supplied to SCI RX port 120 to initiate the reprogramming process. A 20 V dc flash programming signal is then applied to SCI RX port 120 to facilitate the actual flash programming. The 12 V and 20 V signals appear as an input to the connector cube 124 on DRBII/SCI TX input pin 114. These voltage break down Zener diode D3, allowing PNP transistor Q1 to switch "on" and conduct the 12 V or 20 V dc signals out to SBECII/SCI RX output pin 120. The breakdown of zener diode D3 also facilitates the switching "on" of NPN transistor Q3, which shuts "off" NPN transistor Q2, disabling the 12 V or 20 V dc signals from feeding back to the output pin 3 of logic NAND gate U2A.

To facilitate reprogramming in this manner, an on-board interface circuit (not shown) is typically provided within a reprogrammable controller located on the vehicle in order to process the command signals which will enable the non-volatile memory to receive and store new computer program code. The reprogramming method follows a predetermined transfer protocol which includes the transmission of a command signal from the off-board controller which has a voltage level that exceeds the voltage level of any signal which may be recognized on the vehicle signal transfer structure, in this case the "bootstrap" voltage of 12 V or the 20 V flash programming voltage.

ISO9141 MODE

The ISO9141 mode of adapter circuit 100 allows single-wire bi-directional serial communication between a test tool and an electronic controller. Adapter 100 facilitates bi-directional communication to the controller, while supplying a full duplex serial communication path back to the test equipment. The ISO mode, like the SCI mode, is initialized by an appropriate input signal at ASD input 112. If ASD input 112 is driven or pulled down to ground, or if pulled up to 12 V dc, $V_{batt}$, the adapter circuit 100 is put in the ISO9141 mode as follows.

When the ASD input pin 112 is grounded, the open collector output pin 1 of comparator U4A goes to a logical "low" state. When the ASD input 112 goes to 12 V dc, open collector output pin 7 of comparator U4B goes "low". In either case, the result is the same. This "low" output disables input signals on DRBII/SCI TX pin 114 from reaching the SBECII/SCI RX output 120 by disabling NAND gate U2A. At the same time, this "low" output is inverted by NAND gate U2B and becomes an enabling "high" signal to pin 9 of NAND gate U2C. This thereby allows any message signal input from DRBII/SCI TX 114 to reach output SBECII:K/SCI TX pin 118 via a path through resistor R7, NAND gate U2C, inverting NAND gate U2D, resistor R18, transistor Q6 and resistor R21. As a consequence, the message signal is inverted.

At the same time, output pin 6 from NAND gate U2B turns "on" NPN transistor Q4 through resistor R14, which in turn turns "on", through resistor R16, p-channel MOSFET Q5. This supplies $V_{batt}$ (approximately 12 V) to pull-up resistor R20 which in turn facilitates the bias resistor value change that is required to support $V_{batt}$ level communication.

After initialization of the ISO mode in the manner described above, operation in the ISO9141 mode is enabled. A 0–5 V message on DRBII/SCI TX pin 114 is transmitted through SBECII:K/SCI TX output 118 as a $0-V_{batt}$ message. At the same time, the message is echoed back through comparator U1 out to the DRBII/SCI RX output 122 and back to the diagnostic test tool 28. Similarly, SBECII:K/SCI TX pin 118 now acts as an input to adapter circuit 100, and allows $0-V_{batt}$ messages sent from a control module to be received by adapter circuit 100 and transmitted through comparator U1 back out to the diagnostic test tool 28, via DRBII/SCI RX output 122.

The adapter 100 thus permits serial communication between diagnostic test tool 28 and the on-board vehicle controllers, such as the engine and transmission controllers 12 and 14, in either an SCI or ISO mode in a transparent manner. This, in turn, facilitates continued use of diagnostic test equipment, in particular a DRBII, with new vehicle control protocols, as well as those of prior vehicles. Accordingly, a user may employ the adapter circuit 100 in combination with a diagnostic test tool 28 to accomodate vehicle control protocols.

In order to increase clarity in the adapter circuit 100 shown in FIG. 2, the values for the various components were not included thereon. However, for the sake of completeness, these component values are listed below:

| Reference | Part Value |
| --- | --- |
| C2, C9 | .001 µfd |
| C3, C10 | .1 µfd |
| C4, C5 | 100 pfd |
| C6 | .33 µfd |
| C7 | 10 µfd |
| C8 | .0047 µfd |
| D2 | 1N5817 |
| D3 | 1N4739 |
| D4, D5, D6, D8 | 1N4001 |
| Q1 | 2N3906 |
| Q2, Q3, Q4, Q6 | 2N4401 |
| Q5 | Note 1 |
| R4, R7, R13, R15, R25, R26, R31, R32 | 10 k |
| R5 | 510 ohm |
| R6 | 100 k |
| R8 | 400 ohm |
| R9, R10, R11, R14, R16, R18, R19, R22 | 1 k |
| R12 | 825 ohm |
| R17 | 51 ohm |
| R20 | 510 ohm |
| R21 | 51 ohm |
| R24 | 22 k |
| R27, R28 | 47 k |
| R29 | 39 k |
| R30 | 13 k |
| R33 | 510 ohm |
| U1 | IM311 |
| U2 (Note 2) | 74HC00 |
| U3 | 78L05 |
| U4 | IM2903 |

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

We claim:

1. An interface circuit for facilitating serial bi-directional communication between a vehicle controller and a diagnostic test instrument under a plurality of different protocol modes, said interface circuit to be connected between the vehicle controller and said diagnostic instrument, said circuit comprising:

enable circuitry means for enabling bi-directional communication in a selected one of said modes, said enable circuitry means having dedicated signal input means for receiving a signal input that determines the selected mode;

first receive circuitry for receiving a first set of communication signals from the diagnostic test instrument in a predetermined protocol mode;

first translation circuitry responsive to said enable circuitry means and to provide communication of said first set of communication signals to the vehicle controller in said selected mode, said first translation circuitry having means for shifting a voltage potential applied to the vehicle controller;

second receive circuitry, for receiving a second set of communication signals from the vehicle controller in said selected mode; and second translation circuitry to provide communication of said second set of communication signals to the diagnostic test instrument in said predetermined mode.

2. The interface circuit of claim 1 wherein said first translation circuitry includes:

a first circuit path for translating communication signals into one of said modes; and a second circuit path for translating communication signals into another of said modes.

3. The interface circuit of claim 1 wherein one of said protocol modes conforms to an ISO9141 standard.

4. The interface circuit of claim 1 wherein said predetermined mode and one of said protocol modes both conform to a serial communication interface data bus.

5. The interface circuit of claim 1 further comprising bypass circuitry for enabling flash programming communication upon receipt of a relatively high voltage input signal.

6. The interface circuit of claim 1 wherein said first and second translation circuits each comprise means for inverting said first and second sets of communication signals.

7. An interface circuit for facilitating serial bi-directional communication between a vehicle controller and a diagnostic test instrument under a plurality of different protocol modes, said interface circuit to be connected between the vehicle controller and said diagnostic instrument, said circuit comprising:

enable means for enabling bi-directional communication in a selected one of said modes, said enable means having dedicated signal input means for receiving a signal input that determines the selected mode;

first receive circuitry for receiving a first set of communication signals from the diagnostic test instrument in a predetermined protocol mode;

first translation circuitry having a first circuit path for translating said first set of communication signals from said predetermined mode to an ISO 9141 data mode and a second circuit path for translating said communication signals to a second data mode, said first translation circuitry being responsive to said enable circuitry means and to provide communication of said first set of communication signals to the vehicle controller in said selected mode;

second receive circuitry for receiving a second set of communication signals from the vehicle controller in the selected mode; and second translation circuitry to provide communication of said second set of communication signals to the diagnostic test instrument in the predetermined mode.

8. The interface circuit of claim 7 wherein said predetermined mode conforms to a serial communication interface data bus.

9. The interface circuit of claim 7 wherein said first and second translation circuits each comprise means for inverting said first and second sets of communication signals.

10. The interface circuit of claim 7 further comprising bypass circuitry for enabling flash programming communication upon receipt of a relatively high voltage input signal.

11. A method for interfacing a vehicle controller with a diagnostic test instrument so as to facilitate serial bi-directional communication for a plurality of different protocol modes, said method comprising:

receiving a control signal;

selecting one of said protocol modes in response to said control signal;

receiving a first set of communication signals from the diagnostic test instrument in accordance with a predetermined protocol mode;

translating said first set of communication signals into said selected one of the protocol modes by shifting a voltage potential;

outputting said translated set of first communication signals to a vehicle controller;

receiving a second set of communication signals from the vehicle controller in accordance with the selected one of said protocol modes;

translating said second set of communication signals into said predetermined protocol mode by shifting a voltage potential; and outputting said translated second set of communication signals to said diagnostic test instrument.

12. The method of claim 11 wherein said method further interfacing a circuit between the diagnostic instrument and the vehicle controller.

13. The method of claim 11 wherein the steps of translating said first and second sets of communication signals comprises translating specific command signals of said communication signals to command signals having predetermined voltage levels in accordance with the selected mode.

14. The method of claim 11 wherein said steps of translating said first and second sets of communication signals includes inverting the communication signals.

15. The method of claim 11 wherein said modes conform to an ISO9141 standard.

16. The method of claim 11 wherein said predetermined protocol mode conforms to a serial communication interface data bus.

17. The method of claim 11 further comprising the step of initiating a flash reprogramming communication mode in response to a relatively high voltage input.

18. An interface circuit for facilitating serial bi-directional communication between a vehicle controller and a diagnostic test instrument under a plurality of different protocol modes, said interface circuit to be connected between the vehicle controller and said diagnostic instrument, said circuit comprising:

enable circuitry for enabling bi-directional communication in a selected one of said modes;

first receive circuitry for receiving a first set of communication signals from the diagnostic test instrument in a predetermined protocol mode;

first translation circuitry responsive to said enable circuitry and to provide communication of said first set of communication signals to the vehicle controller in said selected mode;

second receive circuitry for receiving a second set of communication signals from the vehicle controller in said selected mode; and second translation circuitry to provide communication of said second set of communication signals to the diagnostic test instrument in said predetermined mode, wherein said first and second translation circuits each comprise means for inverting said first and second sets of communication signals.

19. The interface circuit of claim 18 wherein said first and second translation circuitry comprises means for shifting voltage potential in accordance with the protocol modes.

* * * * *